(12) United States Patent
Cho et al.

(10) Patent No.: US 8,305,516 B2
(45) Date of Patent: Nov. 6, 2012

(54) LIQUID CRYSTAL DISPLAY DEVICE

(75) Inventors: Min-Su Cho, Songam-Ri (KR); Jae-Ho Lee, Daegu (KR); Sang-Dae Lee, Baopheung-Ri (KR)

(73) Assignee: LG Display Co., Ltd., Seoul (KR)

( * ) Notice: Subject to any disclaimer, the term of this patent is extended or adjusted under 35 U.S.C. 154(b) by 138 days.

(21) Appl. No.: 12/536,836

(22) Filed: Aug. 6, 2009

(65) Prior Publication Data
US 2010/0165240 A1    Jul. 1, 2010

(30) Foreign Application Priority Data
Dec. 31, 2008   (KR) .................. 10-2008-0138640

(51) Int. Cl.
*G02F 1/1335*   (2006.01)

(52) U.S. Cl. ............... 349/61; 349/62; 349/63; 349/64; 362/559; 362/612; 362/332; 359/626

(58) Field of Classification Search .............. 349/61–64; 362/559, 612, 332; 359/626
See application file for complete search history.

(56) References Cited

U.S. PATENT DOCUMENTS

| | | | | |
|---|---|---|---|---|
| 2005/0239342 | A1* | 10/2005 | Moriyama et al. | 439/699.2 |
| 2006/0279946 | A1* | 12/2006 | Park et al. | 362/97 |
| 2007/0035679 | A1* | 2/2007 | Lee et al. | 349/58 |
| 2007/0247847 | A1* | 10/2007 | Villard | 362/249 |
| 2008/0278655 | A1* | 11/2008 | Moon et al. | 349/58 |
| 2008/0297701 | A1* | 12/2008 | Lee et al. | 349/68 |
| 2008/0316750 | A1* | 12/2008 | Park | 362/294 |
| 2009/0021932 | A1* | 1/2009 | Kim et al. | 362/237 |
| 2009/0251393 | A1* | 10/2009 | Fan | 345/82 |

FOREIGN PATENT DOCUMENTS

| | | |
|---|---|---|
| CN | 101329047 A | 12/2008 |
| CN | 101329047 * | 6/2010 |
| KR | 10-0845895 * | 7/2007 |
| KR | 10-0845895 * | 7/2008 |
| KR | 100845895 B1 | 7/2008 |

OTHER PUBLICATIONS

Office Action issued in corresponding Chinese Patent Application No. 200910165936.9, mailed Jun. 30, 2011.
Office Action issued in corresponding Chinese Patent Application No. 200910165936.9, mailed Aug. 17, 2012.

* cited by examiner

*Primary Examiner* — Edward Glick
*Assistant Examiner* — Sang Nguyen
(74) *Attorney, Agent, or Firm* — Brinks Hofer Gilson & Lione

(57) ABSTRACT

Disclosed is a liquid crystal display (LCD) device capable of improving a use efficiency of light emitting diode (LED) printed circuit boards (PCBs) by configuring the existing plate type LED PCBs in a bar type so as to reduce an area used, the LCD device including, an LCD panel configured to display images, a backlight unit disposed at a lower portion of the LCD panel for providing light to the LCD panel, and provided with a plurality of light emitting diode (LED) printed circuit boards (PCBs) formed in a bar type, and a plurality of LEDs disposed on each of the LED PCBs to be spaced apart from each other, and casing components including a mold frame for receiving and fixing the LCD panel and the backlight unit, an upper cover and a bottom cover.

6 Claims, 4 Drawing Sheets

LIQUID CRYSTAL DISPLAY DEVICE

RELATED APPLICATIONS

Pursuant to 35 U.S.C. §119(a), this application claims the benefit of earlier filing date and right of priority to Korean Application No. 10-2008-0138640, filed on Dec. 31, 2008, the contents of which is incorporated by reference herein in its entirety.

BACKGROUND

1. Field of the Disclosure

The present disclosure relates to a liquid crystal display (LCD) device, and particularly, to an LCD device with a light emitting diode (LED) backlight unit capable of providing light to an LCD panel via a plurality of LEDs.

2. Description of the Related Art

Displays provide a medium for providing visual information in an information oriented society, and its importance is further emphasized. In order to occupy a leading position, the display should satisfy requirements, such as low power consumption, thin and light configuration, high image quality and the like.

Displays may be classified into a light emitting type, including a cathode ray tube (CRT), an electroluminescence (EL), a light emitting diode (LED), a vacuum fluorescent display (VED), a field emission display (FED), a plasma display panel (PDP) and the like, and a non-light emitting type which does not emit light by itself, such as a liquid crystal display (LCD).

An LCD device denotes a device for representing an image by using an optical anisotropy characteristic of a liquid crystal. The LCD device can provide a superior visibility to a CRT and implement lower average power consumption than a CRT having the same screen size. Further, it generates a low heating value. Hence, the LCD device is getting spotlighted as a next generation display device, together with the PDP.

Liquid crystal used in the LCD device is not a light emitting material which generates its own light by itself but a photospheric material by which an amount of light coming from the outside is modulated to display an image on a screen. Accordingly, the LCD device requires a separate light source, namely, a backlight unit, for radiating light onto an LCD panel.

Hereinafter, the LCD device will be described in detail.

Even if any specific description is not given, a portion where a lamp is located in an LCD device is referred to as a lower portion, and a portion where an LCD panel is located is referred to as an upper portion.

An LCD device may include an LCD panel having a liquid crystal injected between an array substrate and a color filter substrate for outputting an image, a backlight unit installed at a lower portion of the LCD panel for emitting light all over the LCD panel, and a plurality of casing components for fixedly coupling the LCD panel and the backlight unit to each other.

The backlight unit functions to create plane light with uniform brightness from a lamp used as a light source. Thickness and power consumption of the LCD device may depend on how thin the backlight unit is configured and how efficiently light is useable.

Such backlight units may be divided into an edge type and a direct type according to a position of a light source with respect to a display surface. Further, the light source of the backlight unit may be either a linear light source or a point light source. Here, an example of the linear light source may be a cold cathode fluorescent lamp (CCFL), and an example of the point light source may be a light emitting diode (LED).

The CCFL has often been used as the existing light source of the backlight unit. However, following the recent tendency of an LCD device becoming small, thin and light, it is increased to use an LCD device, which employs a light emitting diode advantageous in view of power consumption, weight, brightness and the like, as a light source of the backlight unit.

Hereinafter, a related art LCD device will be described in detail with reference to the accompanying drawings.

FIG. 1 is a disassembled view showing a schematic configuration of a related art LCD device.

Also, FIG. 2 is a view of a direct type LED backlight unit in the related art LCD device of FIG. 1.

As shown in FIG. 1, a related art LCD device includes an LCD panel 1 for outputting an image, a plurality of LEDs 2 disposed at a lower portion of the LCD panel 1 for emitting light to the LCD panel 1, a diffusion plate 3 disposed between the LCD panel 1 and the LEDs 2 for diffusing light emitted from the LEDs 2, optical sheets 6 for converting light discharged from the diffusion plate 3 to supply to the LCD panel 1, and a bottom cover 7 for covering the LEDs 2.

As shown in FIG. 2, the direct type LED backlight unit employs a method of aligning an LED printed circuit board (PCB) 8, having the LEDs 2 mounted thereon with the bottom cover 7 in a plate type for coupling therebetween.

Here, size and number of the LED PCB 8 depend on a size of the backlight unit and a size capable of employing a surface mounting technology (SMT).

Such fabricated LED PCBs 8 are coupled to the bottom cover 7 by use of screws, holders or the like, together with a reflection sheet (not shown).

In the meantime, the LED backlight unit using the LEDs 2 as light sources further includes the LED PCB 8, as compared to a CRT, thereby causing an increase in fabricating cost.

Further, for coupling the plate type LED PCBs 8 onto the bottom cover 7, the LED PCBs 8 unfortunately use a larger area which is larger than that required for actually installing LEDs and for wiring.

That is, because there is no method provided by which an LED package is mounted and wired directly on the bottom cover, a method has been employed, by which the LED package is first mounted on each LED PCB and then wiring is completed. However, an area of the printed circuit board several times larger than an area used for the LED package and the wiring is used, resulting in consumption of the PCB. That is, a large area of the PCB is used to cover the entire surface of the bottom cover in order to uniformly arrange the LED package all over the backlight unit. Accordingly, a loss of usage area of the LED printed circuit board is caused, and the use efficiency on a mother substrate is also lowered.

BRIEF SUMMARY

An LCD device includes, an LCD panel configured to display images, a backlight unit disposed at a lower portion of the LCD panel for providing light to the LCD panel, and provided with a plurality of light emitting diode (LED) printed circuit boards (PCBs) formed in a bar type, and a plurality of LEDs disposed on each of the LED PCBs to be spaced apart from each other; and casing components including a mold frame for receiving and fixing the LCD panel and the backlight unit, an upper cover and a bottom cover.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Description will now be given in detail of the preferred embodiments of an LCE device according to the present invention, with reference to the accompanying drawings.

Figure 1:
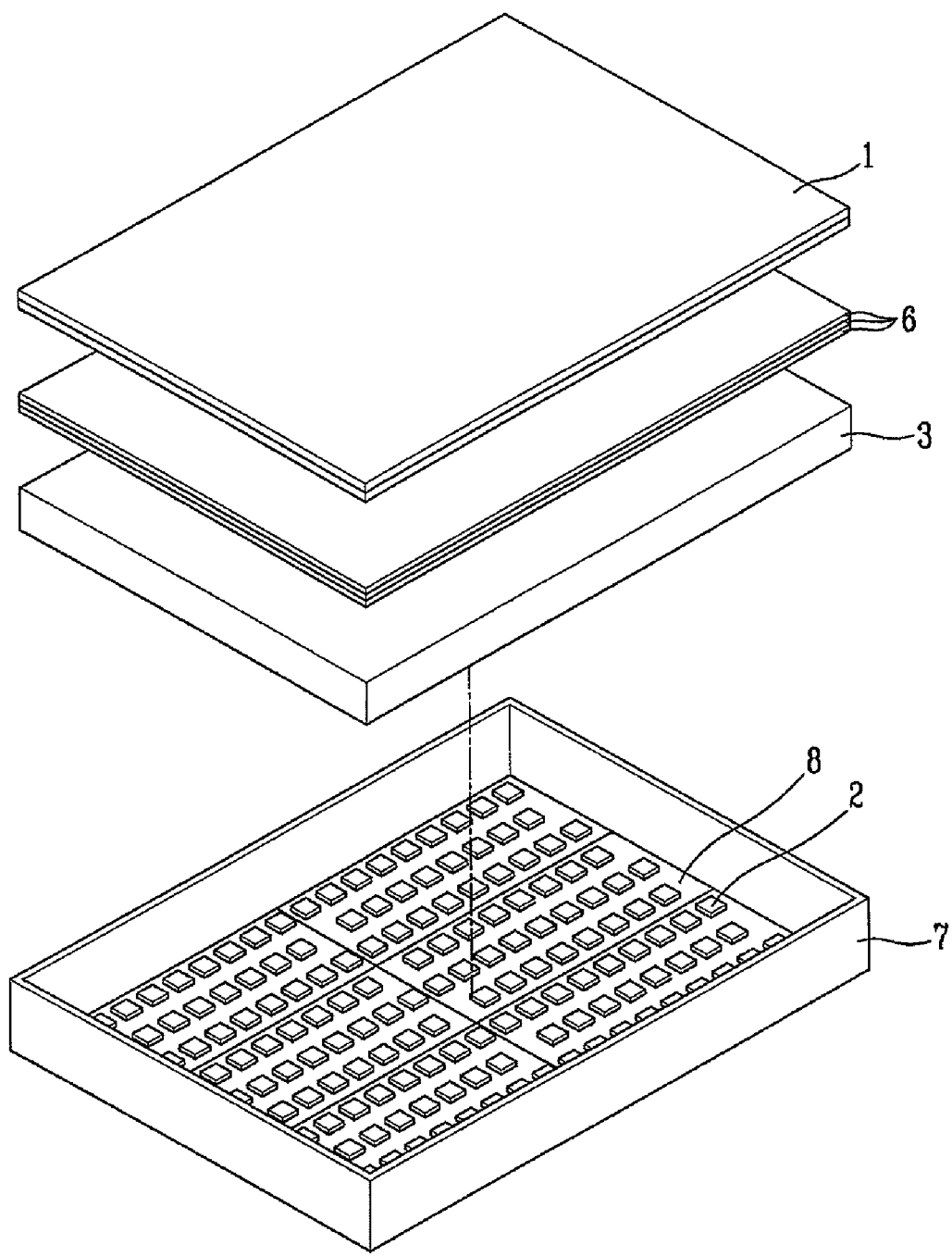
FIG. 1 is a disassembled view showing a schematic configuration of a related art LCD device.
Figure 2:
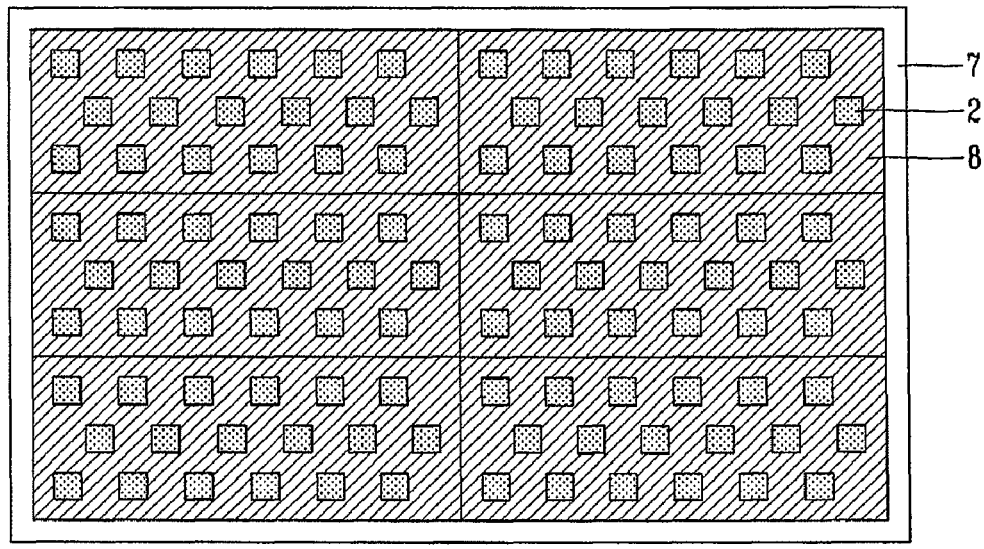
FIG. 2 is a view of a direct type LED backlight unit in the related art LCD device of FIG. 1.
Figure 3:
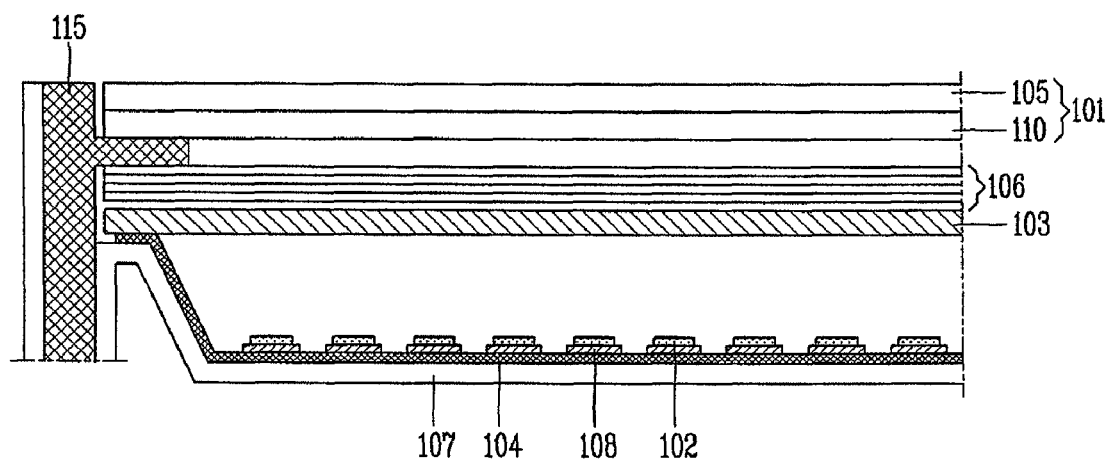
FIG. 3 is a cross-sectional view showing a structure of an LCD device in accordance with an embodiment of the present disclosure.

FIG. 3 is a cross-sectional view showing a structure of an LCD device in accordance with the present disclosure, which schematically shows a part of an LCD device with a direct type LED backlight unit.

As shown in FIG. 3, an LCD device according to the present disclosure may include an LCD panel 101 for outputting an image, a backlight unit 109 disposed at a lower portion of the LCD panel 101 for providing light towards the LCD panel 101, and casing components, such as a mold frame 115 for accommodating and fixing the LCD panel 101 and the backlight unit 109, an upper cover (not shown), a bottom cover 107 and the like.

Here, the LCD panel 101 may include a color filter substrate 105, an array substrate 110 and a liquid crystal layer (not shown) interposed between the color filter substrate 105 and the array substrate 110.

Further, although not shown in the drawing, the color filter substrate 105 may be provided with a color filter with a plurality of sub-color filters for implementing red (R), Green (G) and blue (B) colors, a black matrix partitioning the sub-color filters and blocking light transmitted through the liquid crystal layer, and a transparent common electrode for applying a voltage to the liquid crystal layer.

The array substrate 110 may be provided with a plurality of gate lines and data lines arranged in longitudinal and horizontal directions for defining a plurality of pixel regions, thin film transistors as switching devices each disposed at an intersection between the gate line and the data line, and pixel electrodes each formed on the pixel region. Here, the gate line and the data line may electrically be connected respectively to a gate printed circuit board (PCB) and a data PCB via a gate tape carrier package (TCP) and a data TCP.

Here, the backlight unit 109 according to the present invention may be configured in a direct type having a plurality of LEDs 102 disposed at the lower portion of the LCD panel 101.

The backlight unit 109 may include a plurality of LED PCB 108 each formed in a bar type on the bottom cover 107, a plurality of LEDs 102 disposed on each of the LED PCBs 108 to be spaced apart from each other, and a diffusion plate 103 and a plurality of optical sheets 106 both disposed above the plurality of LEDs 102 for diffusing and condensing light emitted from the LEDs 102.

Here, the LED PCB 108 may be implemented as a metal core PCB (MPCB) having an aluminum layer stacked on its lower surface so as to discharge heat generated from each of the LEDs 102 as the light sources.

A reflection sheet 104 may be formed at a periphery of the plurality of LEDs 102 so as to upwardly reflect light emitted from the plurality of LEDs 102, thereby improving optical efficiency.

Here, the LED 102 may be configured such that one LED for representing red, green and blue colors is disposed within an LED lamp (or chip). Alternatively, the LED 102 may be configured in a form of package including LEDs representing red, green and blue colors, respectively. Such LED package can be advantageous in view of well representing mixture colors of red, green and blue colors and improving brightness.

The LED 102 for representing red, green and blue colors was exemplarily described; however, the LED 102 can generate white color except for the red, green and blue colors or various colors of light depending on the purpose of use. Alternatively, the LED 102 may generate different colors of light according to the purpose of use or be divided into a preset number of groups so as to generate different colors of light by each group.

In particular, the LED PCB 108 according to the present invention may be characterized in that the existing plate type PCB is replaced with a bar type PCB and thus a usage area can be reduced, thereby improving the use efficiency of the PCB 108. Such configuration will be described in detail with reference to FIG. 4.

Figure 4:
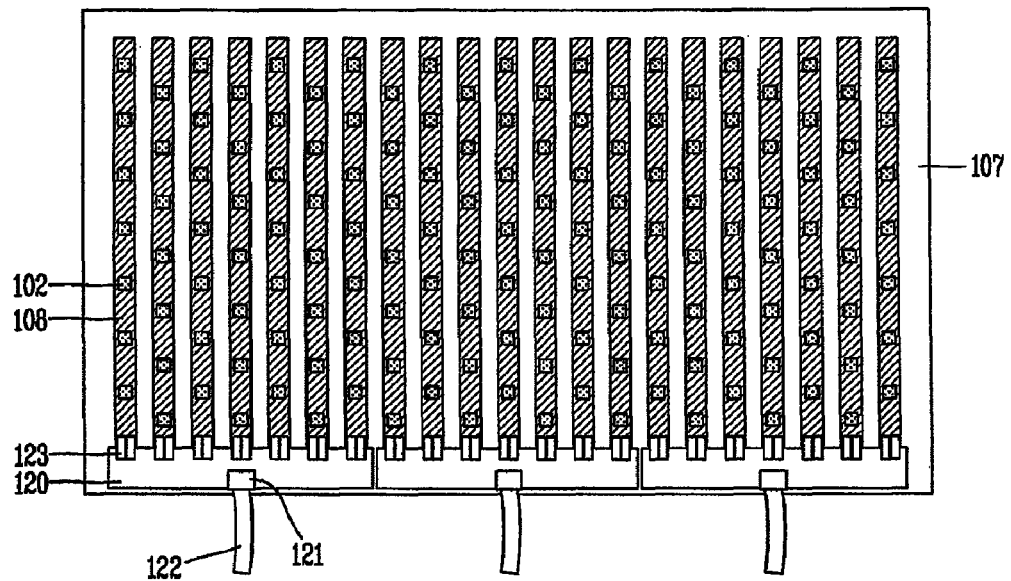
FIG. 4 is a plane view showing a structure of an LED backlight unit in accordance with a first embodiment of the present disclosure.

FIG. 4 is a plane view showing a structure of an LED backlight unit in accordance with a first embodiment of the present invention.

As shown in FIG. 4, an LED backlight unit according to a first embodiment of the present invention may include a plurality of LED PCBs 108 formed in a bar type on the bottom cover 107, a plurality of LEDs 102 disposed on each of the LED PCBs 108 to be spaced apart from each other, and a diffusion plate (not shown) and a plurality of optical sheets (not shown) both disposed above the plurality of LEDs 102 so as to diffuse and condense light emitted from the LEDs 102.

Here, the plurality of bar type LED PCBs 102 may be divided into several groups, thus to be electrically connected to corresponding connection PCBs 120 via connection members 123. Also, the connection PCBs 120 may be connected to a driving unit PCB (not shown), having driving components mounted for driving the LEDs 102, via cables 122 connected to connectors 121. That is, the LED backlight unit according to the first embodiment of the present invention may be configured such that the connection PCB 120 for connecting the bar type LED PCBs 108 within the corresponding group to one another is installed so as to allow wiring between the plurality of LED PCBs 108, and also function to connect each of the LED PCBs 108 to a driving driver.

The LED backlight unit according to the first embodiment of the present invention can improve the use efficiency of the area of the PCB unnecessarily used in the LED backlight unit by replacing the existing plate type LED PCB to the bar type LED PCB. That is, the bar type LED PCB can be fabricated to have a minimal area in which LEDs are substantially mounted, thereby improving the use efficiency of the unnecessarily used PCB.

Here, the bar type LED PCBs may be arranged in a horizontal direction or a longitudinal direction to be widely distributed as the LEDs are periodically arranged.

Further, in order to couple a diffusion plate located on the LED PCB 108, spacers for maintaining a uniform height may be installed between the LED PCBs 108 by considering a gap between each LED PCB 108 and the diffusion plate and an optical distance.

Meanwhile, the LED backlight unit according to the first embodiment of the present invention uses the individual bar type LED PCBs, which requires connection PCBs. Also, many connection members are needed between the LED PCBs and the connection PCBs.

Figure 5:
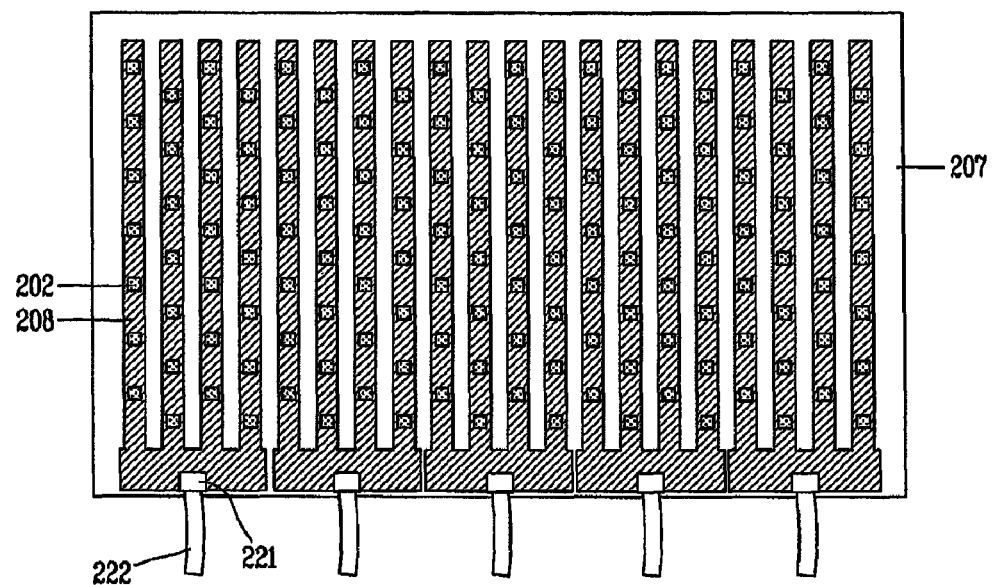
FIG. 5 is a plane view showing a structure of an LED backlight unit in accordance with a second embodiment of the present disclosure.

FIG. 5 is a plane view showing a structure of an LED backlight unit in accordance with a second embodiment of the present invention, which shows that one ends of bar type LED PCBs are connected to be fabricated in a form of two through eight pronged spears, resulting in non-use of the connection PCBs.

As shown in FIG. 5, an LED backlight unit according to a second embodiment of the present invention may include a plurality of LED PCBs 208 formed in a bar type on a bottom cover 207 and having one ends all connected, a plurality of LEDs 202 disposed on each of the LED PCBs 208 to be spaced apart from each other, and a diffusion plate (not shown) and a plurality of optical sheets (not shown) disposed above the plurality of LEDs 202 for diffusing and condensing light emitted from the LEDs 202.

Here, four of the bar type LED PCBs 208 may be fabricated in a form of four-pronged spears by connecting their one ends. Also, the four LED PCBs 208 connected in the form of four-pronged spears may be connected, via a cable 222 connected to a connector 221, to a driving unit PCB (not shown) having driving components for driving the LEDs 202 mounted thereon. That is, the LED backlight unit according to the second embodiment of the present invention can be implemented by fabricating four of the bar type LED PCBs 208 in the form of the four-pronged spears by connecting the one ends thereof, so as to implement a local dimming with respect to the plurality of LEDs 202. Such fabrication can reduce the number of connectors required. In addition, it makes it possible to directly connect the LED PCBs 208 to an LED driving driver without connection PCBs.

Here, the present invention may not be limited to the LED PCBs in the form of the four-pronged spears. Alternatively, the present invention may be applicable to any case where two or more of bar type LED PCBs are connected at their one ends so as to be in the form of two or more pronged spears.

The bar type LED PCBs 208 may be mounted on the bottom cover 207 by using screws or by inserting the bar type LED PCBs 208 in the two through eight pronged spears at once. Further, holes or protrusions may be formed at the bar type LED PCBs 208 so as to be slid into the bottom cover 207.

Here, the bar type LED PCBs 208 may be arranged in a horizontal direction or a longitudinal direction to be widely distributed as the LEDs are periodically arranged.

Further, in order to couple a diffusion plate located on the LED PCB 208, spacers for maintaining a uniform height may be installed between the LED PCBs 208 by considering a gap between each LED PCB 208 and the diffusion plate and an optical distance.

The LED backlight unit according to the second embodiment of the present invention can improve the use efficiency of the area of the PCB unnecessarily used in the LED backlight unit by replacing the existing plate type LED PCB to the bar type LED PCB. That is, the bar type LED PCB can be fabricated to have a minimal area in which LEDs are substantially mounted, thereby improving the use efficiency of the unnecessarily used PCB.

In particular, in the LED backlight unit according to the second embodiment of the present invention, two or more of the bar type LED PCBs are connected at their one ends so as to be fabricated in the form of two or more pronged spears, thereby reducing the number of connectors required. In addition, connection PCBs are not required so as to effectively reduce the fabricating cost.

Figure 6:
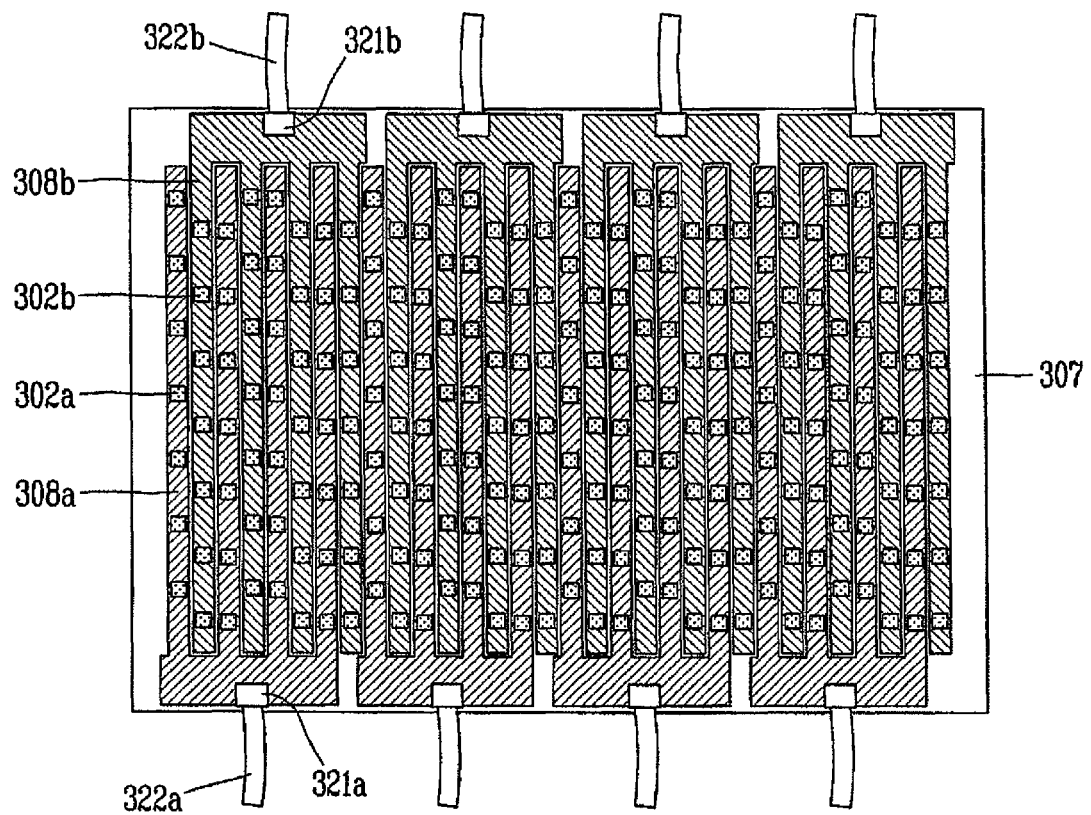
FIG. 6 is a plane view showing a structure of an LED backlight unit in accordance with a third embodiment of the present disclosure.

FIG. 6 is a plane view showing a structure of an LED backlight unit in accordance with a third embodiment of the present invention, which exemplarily shows that one ends of bar type LED PCBs are connected to be fabricated in a form of two to eight pronged spears so as to use no connection PCB, and the LED PCBs in the form of two to eight pronged spears are engaged with each other so as to maximize the use efficiency of the LED PCBs.

As shown in FIG. 6, an LED backlight unit according to a third embodiment of the present invention may include a plurality of LED PCBs 308a and 308b formed in a bar type on a bottom cover 307 and having one ends all connected, a plurality of LEDs 302a and 302b disposed on each of the LED PCBs 308a and 308b so as to be spaced apart from each other, and a diffusion plate (not shown) and a plurality of optical sheets (not shown) disposed above the plurality of LEDs 302a and 302b for diffusing and condensing light emitted from the LEDs 302a and 302b.

Here, four of the bar type LED PCBs 308a and 308b may include first LED PCBs 308a and second LED PCBs 308b engaged with each other.

The first and second LED PCBs 308a and 308b are connected at their one ends to be fabricated in a form of four-pronged spears. Also, the four first LED PCBs 308a connected in the form of the four-pronged spears and the four second LED PCBs 308b connected in the form of the four-pronged spears may be connected to first and second driving unit PCBs (not shown), respectively having driving components for driving the first and second LED PCBs 302a and 302b mounted thereon, via first and second cables 322a and 322b connected to first and second connectors 321a and 321b, respectively.

Here, the present invention may not be limited to the LED PCBs in the form of the four-pronged spears. Alternatively, the present invention may be applicable to any case where two or more of bar type LED PCBs are connected at their one ends so as to be in the form of two or more pronged spears and the two or more pronged LED PCBs are engaged with each other.

Here, the bar type first and second LED PCBs 308a and 308b may be arranged in a horizontal direction or a longitudinal direction to be widely distributed as the first and second LEDs 302a and 302b are periodically arranged.

Further, in order to couple the diffusion plate located on each of the first and second LED PCBs 308a and 308b, spacers for maintaining a uniform height may be installed between the first and second LED PCBs 308a and 308b by considering a gap between each of the first and second LED PCBs 308a and 308b and the diffusion plate and an optical distance.

The LED backlight unit according to the third embodiment of the present invention can improve the use efficiency of the area of the PCB unnecessarily used in the LED backlight unit by replacing the existing plate type LED PCB to the bar type LED PCB, as similar to the first and second embodiment of the present invention. That is, the bar type LED PCB can be fabricated to have a minimal area in which LEDs are substantially mounted, thereby improving the use efficiency of the unnecessarily used PCB.

In particular, in the LED backlight unit according to the third embodiment of the present invention, two or more of the bar type LED PCBs are connected at their one ends so as to be fabricated in the form of two or more pronged spears, thereby reducing the number of connectors required. In addition, connection PCBs are not required so as to effectively reduce the fabricating cost. Also, by allowing the two or more pronged LED PCBs to be engaged with each other, the use efficiency of the LED PCBs can be maximized, resulting in a more effective reduction of fabricating cost.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A liquid crystal display (LCD) device comprising:
an LCD panel configured to display images;
a backlight unit disposed at a lower portion of the LCD panel that provides light to the LCD panel, and having a plurality of light emitting diode (LED) printed circuit boards (PCBs) portions formed in a bar type, and a plurality of LEDs disposed on each of the LED PCBs portions to be spaced apart from each other,
wherein the plurality of bar type LED PCBs portions are divided into several first groups and several second groups,
wherein one end of several bar type LED PCBs portions of each first group are connected at each single first connection portion such that each first group of the bar type LED PCBs portions and each single first connection portion are parts of a single first printed circuit board defining two to eight pronged spears and spaces between the two to eight pronged spears,
wherein one end of several bar type LED PCBs portions of each second group are connected at each single second connection portion disposed at a side opposite to the first connection portion such that each second group of the bar type LED PCBs portions and each single second connection portion are parts of a single second printed circuit board defining two to eight pronged spears and spaces between the two to eight pronged spears, the first connection portions and the second connection portions opposing each other, and
wherein the several bar type LED PCBs portions of each first group and the several bar type LED PCBs portions of each second group are arranged in an opposite direction to each other such that the pronged spears of each first group of the bar type LED PCBs portions are disposed in corresponding spaces of a corresponding one of the several bar type LED PCBs portions of each second group; and
casing components including a mold frame for receiving and fixing the LCD panel and the backlight unit, an upper cover and a bottom cover.

2. The device of claim 1, further comprising a diffusion plate and a plurality of optical sheets both disposed above the plurality of LEDs and configured to diffuse and condense light emitted from the LEDs.

3. The device of claim 1, wherein the bar type LED PCBs portions are arranged in a horizontal direction or a longitudinal direction to be widely distributed as the LEDs are periodically arranged.

4. The device of claim 1, wherein the bar type LED PCBs portions are coupled to the bottom cover by screws.

5. The device of claim 1, wherein the bar type LED PCBs portions in the form of two to eight pronged spears are inserted in the bottom cover at once.

6. The device of claim 1, wherein the bar type LED PCBs portions in the form of two to eight pronged spears are provided with holes or protrusions to be slid into the bottom cover.

* * * * *